(12) United States Patent
Black et al.

(10) Patent No.: US 7,460,842 B2
(45) Date of Patent: Dec. 2, 2008

(54) WIRELESS TRANSMITTER HAVING POLAR LOOP CONTROLLER WITH CURRENT FEEDBACK AND METHODS

(75) Inventors: Greg R. Black, Vernon Hills, IL (US); Matt C. Hayek, Libertyville, IL (US)

(73) Assignee: Motorola, Inc., Schaumburg, IL (US)

( * ) Notice: Subject to any disclaimer, the term of this patent is extended or adjusted under 35 U.S.C. 154(b) by 451 days.

(21) Appl. No.: 11/222,479

(22) Filed: Sep. 8, 2005

(65) Prior Publication Data

US 2007/0054635 A1 Mar. 8, 2007

(51) Int. Cl.
*H04B 1/04* (2006.01)

(52) U.S. Cl. .............. 455/127.1; 455/127.2; 455/127.3; 455/115.1; 455/121; 455/126

(58) Field of Classification Search .............. 455/127.1, 455/127.2, 127.3, 115.1, 121, 126, 107
See application file for complete search history.

(56) References Cited

U.S. PATENT DOCUMENTS

| | | | |
|---|---|---|---|
| 6,701,134 B1 | 3/2004 | Epperson | |
| 6,701,138 B2 | 3/2004 | Epperson | |
| 7,109,897 B1 | 9/2006 | Levesque | |
| 7,196,583 B2* | 3/2007 | Clifton et al. | 330/285 |
| 2002/0090921 A1* | 7/2002 | Midtgaard et al. | 455/126 |
| 2004/0185809 A1* | 9/2004 | Jenkins | 455/127.2 |
| 2005/0064827 A1 | 3/2005 | Schumacher et al. | |
| 2005/0227646 A1* | 10/2005 | Yamazaki et al. | 455/127.3 |

OTHER PUBLICATIONS

Maxim Integrated Products; "Low-Cost, Low-Voltage, PA power Control Amplifier for GSM Applications in 8-Pin GFN"; pp. 1-7.

* cited by examiner

*Primary Examiner*—Sanh D Phu
(74) *Attorney, Agent, or Firm*—Roland K. Bowler, II

(57) ABSTRACT

A wireless transmitter (100) including an amplifier (112), an automatic output controller (116) (AOC) having an output coupled to a control signal input. The AOC detects a second amplifier parameter that changes with a change in load impedance during a transmission, and the AOC reduces a change in transmitter output power related to the change in load impedance based on a first parameter and the detected second parameter during the same transmission during which the second parameter was detected.

19 Claims, 6 Drawing Sheets

WIRELESS TRANSMITTER HAVING POLAR LOOP CONTROLLER WITH CURRENT FEEDBACK AND METHODS

FIELD OF THE DISCLOSURE

The present disclosure relates generally to wireless communications, and more particularly to amplifier and wireless transmitter architecture, for examples, those used in cellular communication devices, and corresponding methods.

BACKGROUND

Wireless transmitters used in cellular, trunked, point-to-point and other wireless communication applications often utilize automatic output controllers to control and stabilize transmitter output during transmission and to improve radio link performance. In mobile cellular communication terminals, for example, variations in output power may result in inadequate signal power at the base station receiver. Output variations also cause variations in current drain, resulting in unnecessary heat dissipation and in reduced talk-time performance in battery-powered mobile communication devices.

In most communications applications, the automatic output controller (AOC) system provides a variable output. In cellular communications systems, for example, the output of the cellular handset is controlled to a variable power level requested by the base station. In time division multiple access systems, the transmitter operates in a burst mode. In burst mode transmitters, it is important that the power level be controlled smoothly and accurately during ramp-up and ramp-down of the transmission burst in order produce the required output, while avoiding out of band spectral emissions. In amplitude modulation communications systems, the transmitter output level varies according to the transmission data. A precise output level is needed to accurately demodulate the signal and to avoid out of band spectral emissions.

In most communications equipment, the output power is factory calibrated for some particular load impedance, typically 50Ω. In many wireless applications, it is important that the transmitter output level and current drain be controlled accurately while the load impedance varies. In wireless communication devices, load impedance variation is caused largely by variable antenna impedance. In mobile telephone handsets, for instance, the antenna input impedance varies with changes in the proximity of the handset to the user.

The various aspects, features and advantages of the disclosure will become more fully apparent to those having ordinary skill in the art upon careful consideration of the following Detailed Description thereof with the accompanying drawings described below.

DETAILED DESCRIPTION

Figure 1:
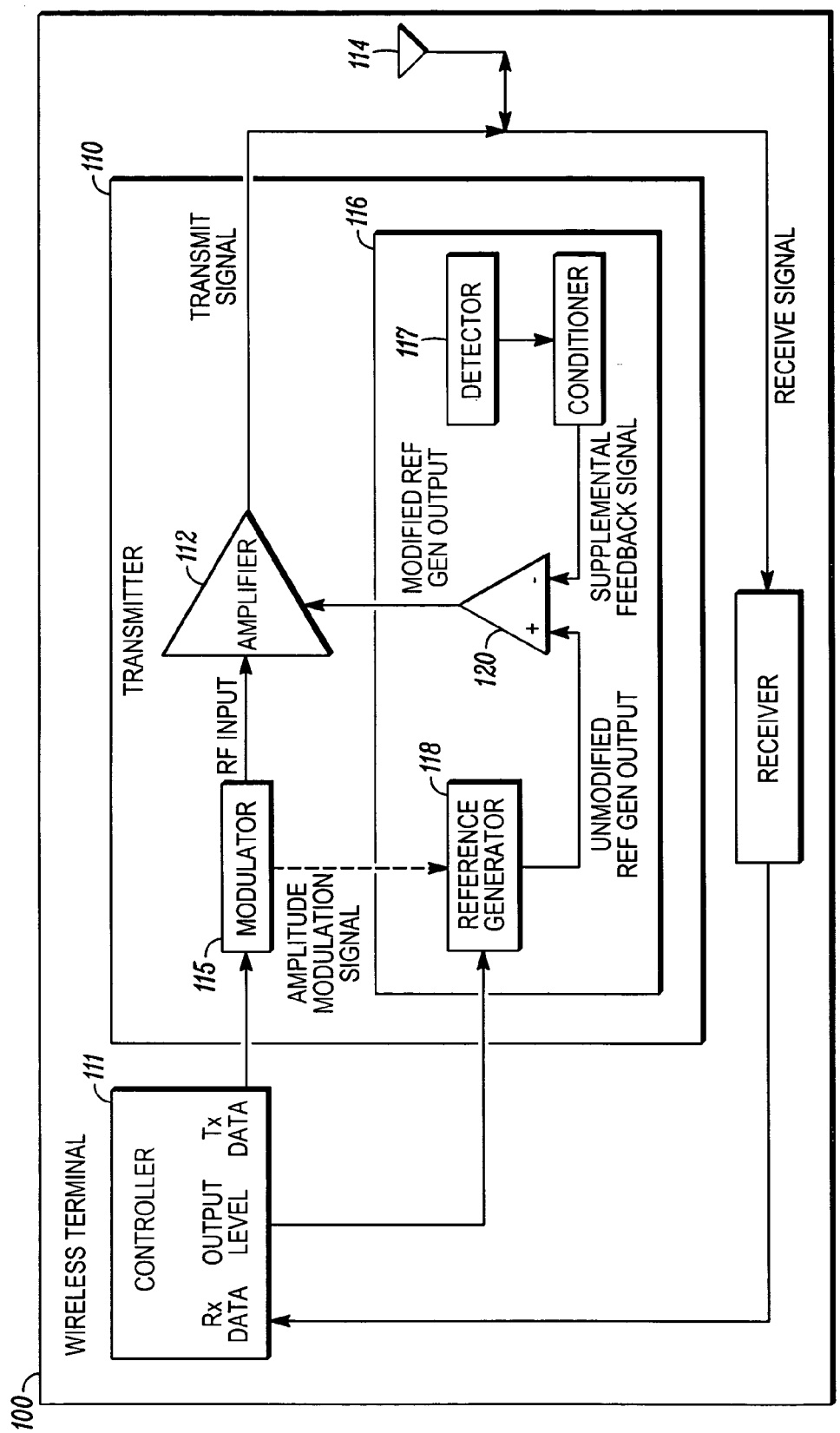
FIG. 1 is an illustrative wireless transmitter architecture.

The transmitters in the present disclosure employ either an opened or closed loop primary automatic output controller (AOC) for controlling a first output parameter, modified with feedback control of supplemental or secondary (second) output parameter. The secondary output parameter is generally one that varies with changes in output impedance. The secondary output parameter may also vary monotonically with power delivered to the load. In one embodiment, the AOC provides supplemental feedback to an amplifier to stabilize transmitter output power and current drain at the initial transmission. The supplemental feedback may be linear or non-linear feedback that can be compensated with pre-distortion, for example, in systems employing logarithmic detection. In amplitude modulating communication systems, for example, linear controlling methods may be used.

In one embodiment, the automatic output control is non-limiting. A limiting automatic output controller causes the output power to abruptly stop increasing at a certain power level. The abrupt change in power from an increasing level to a constant level causes spectral growth which causes interference to other radio transceivers and may violate the spectral emission requirements. Limiting also distorts modulation in such a way that it cannot be corrected by predistortion.

One automatic output controller (AOC) system that provides power stability over varying load impedance is a forward voltage controlling AOC system. Forward voltage controlling systems however employ directional couplers for detecting the forward voltage. In some embodiments of the instant disclosure, the directional coupler is eliminated, partly because the coupler is costly and difficult to integrate. The automatic output controllers disclosed herein are readily integrated in transmitter architectures. In one embodiment, the AOC generates a control signal that controls the amplifier transmit signal level and more particularly controls current and/or voltage parameters of the amplifier output. The AOC also controls and stabilizes the output level with variations in temperature. In polar modulating systems, the AOC system contains a modulator that generates an Amplitude Modulation (AM) signal as a reference for amplitude modulation control and stabilization. In one embodiment, the AOC is an amplitude-modulating AOC that controls the modulation of the amplifier output.

The supplemental feedback circuit has a gain, H. In one embodiment, the gain H comprises that of the cascaded gain of a detector, a conditioner and a difference circuit. In one embodiment, the value of H is sufficiently low that the supplemental feedback loop does not fully negate the effect of the AOC for controlling the first or primary output parameter. Thus for example a voltage controlling AOC may be supplemented with current control, or a current control technique may be supplemented with voltage control, since in either case the supplemental controlling parameter generally varies monotonically with output power.

A first illustrative embodiment is an open loop controlling AOC that is supplemented by closed loop feedback control. In FIG. 1, a wireless communication device or terminal 100 comprises a transmitter 110 having an amplifier 112 with an output coupled to a load in the exemplary form of an antenna 114. The communication device also includes a radio controller 111 that provides an amplifier output level control signal and transmit data to the transmitter. The wireless communication device may be a cellular telephone handset, a personal digital assistant (PDA), a wireless card for a laptop or notebook computer, among other wireless communication device implementations.

In FIG. 1, the transmitter also comprises a modulator 115 coupled to the input of the amplifier 112 and an automatic output controller (AOC) 116 having an output coupled, at least indirectly, to a control signal input of the amplifier. The controller 111 provides transmit data to the modulator 115, and the controller provides an output level control signal to the AOC. In one embodiment, the controller has a calibrated output coupled to the AOC, wherein the AOC output is calibrated for a particular amplifier output level at nominal load impedance.

In one open loop embodiment, the automatic output controller (AOC) detects a supplemental parameter of the transmitter output that changes with changes in transmitter load impedance during a transmission. The secondary parameter may be either current or voltage. In one embodiment, the reference generator output signal is modified by subtracting a supplemental feedback signal to create a modified PAC signal. The supplemental feedback signal is generated by the detector which generates a signal proportional to the supplemental controlling output parameter. The detector output is typically routed to a signal conditioner, for example, a linear conditioner, to generate the supplemental feedback signal. An example of a detector with a conditioner is an active detector with gain, or a log detector. The supplemental feedback signal is subtracted from the AOC reference generator signal in a difference circuit to generate an error signal.

In FIG. 1, the supplemental voltage or current parameter is detected by a detector 117, the output of which may be conditioned by a conditioner. In this illustrative embodiment, the automatic output controller reduces a change in transmitter output power related to the change in load impedance based on the detected supplemental parameter and another parameter during the same transmission during which the supplemental parameter was detected. Control of the transmitter or amplifier output during the same transmission interval during which the controlling parameter is detected is referred to herein as "real-time" control.

In FIG. 1, the automatic output controller includes a reference generator 118, wherein the automatic output controller modifies an output of the reference generator (Unmodified REF GEN Output) based on the detected voltage or current parameter. The automatic output controller (AOC) provides a modified output signal (Modified REF GEN Output) to the amplifier control signal input. In one embodiment, the first parameter of the amplifier output is dependent on only the control signal input of the amplifier.

If the second parameter is an output voltage, the primary parameter used by the AOC to control the output is an output current. If the second parameter is an output current, the primary parameter used by the AOC to control the output is an output voltage. In open loop controllers the current or voltage is stable with respect to an amplifier control signal. In one embodiment, for example, the detected parameter is a current, the other parameter controlled by the AOC is an output voltage, and the amplifier control signal input is a DC supply voltage. In a more particular implementation, the second parameter is the amplifier collector or drain current wherein the AOC modifies the DC supply voltage of the amplifier by modifying either a collector or drain voltage of the amplifier. In this case, in FIG. 1, the detector 117 is a current detector. The amplifier collector or drain current may be measured by measuring a voltage across a resistor in series with the collector or drain.

In another embodiment, the second parameter is a voltage, the primary or first parameter controlled by the AOC is an output current, and the amplifier control signal input is a DC supply current control signal, wherein the output of the automatic output controller is based on the detected output voltage. In this and other embodiments where the second parameter is a voltage, in FIG. 1, the detector 117 is a voltage detector, for example, a peak RF voltage detector.

In another embodiment, the second parameter of the transmitter that changes with variations in load impedance is either a collector voltage or drain voltage of the amplifier, and the supply current of the amplifier is modified by modifying the DC bias level of the amplifier, for example, at either a gate or a base thereof depending on the amplifier type.

In FIG. 1, the automatic output controller (AOC) includes a summer 120 modifying the output of the reference generator based on low gain feedback of the detected second parameter. In this embodiment, the output of the reference generator is modified based on the low gain feedback of the detected current or voltage parameter, wherein the feedback reduces the variation in output power with variations in load impedance.

Figure 2:
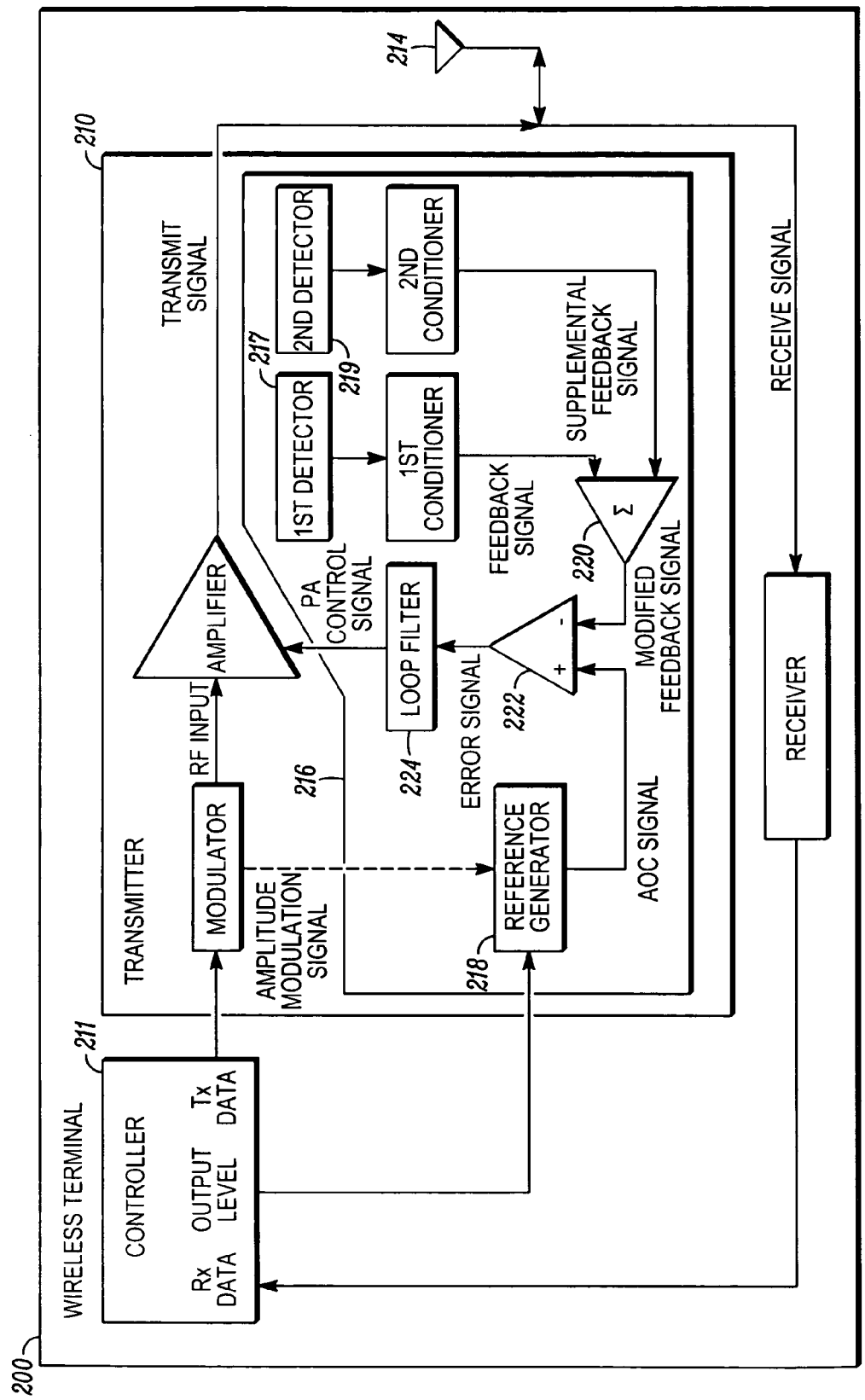
FIG. 2 is a wireless transmitter architecture.

In FIG. 2, the illustrative wireless communication device or terminal 200 comprises a transmitter 210 having an amplifier with an output coupled to an antenna load 214. The device also includes a controller 211 for providing data and output level control information to the transmitter 210. The transmitter includes an automatic output controller (AOC) 216 having a reference generator 218. The AOC 216 includes a first detector 217 that detects the first parameter and a second detector 219 that detects the second parameter. In one embodiment, the first parameter is current and the second parameter is voltage. In another embodiment, the first parameter is a voltage and the second parameter is a current. In the illustrative embodiment of FIG. 2, first and second feedback signals are provided based on the detected first and second parameters, and the feedback signals are summed by a summer 220. An error signal generator 222 provides an error signal proportional to a difference between an output of the reference generator 218 and a summation of the first and second feedback signals, wherein the automatic output controller output is a PA control signal coupled to the amplifier based on the error signal.

In some embodiments, the error signal is filtered by a loop filter 224. The loop filter typically is a linear low pass filter. It may be a passive filter, an active buffer or an amplifier. The loop filter may be integral to the difference circuit. The loop filter gain and the bandwidth are dependant on the transfer functions of other circuits in the control loop to achieve stability of the feedback control loop according to the overall loop gain. In one embodiment, the loop gain is the combined transfer function of the PA, detector, conditioner, difference amplifier and loop filter. A large loop gain causes the error signal to be small and the output level to accurately track the AOC signal.

Figure 3:
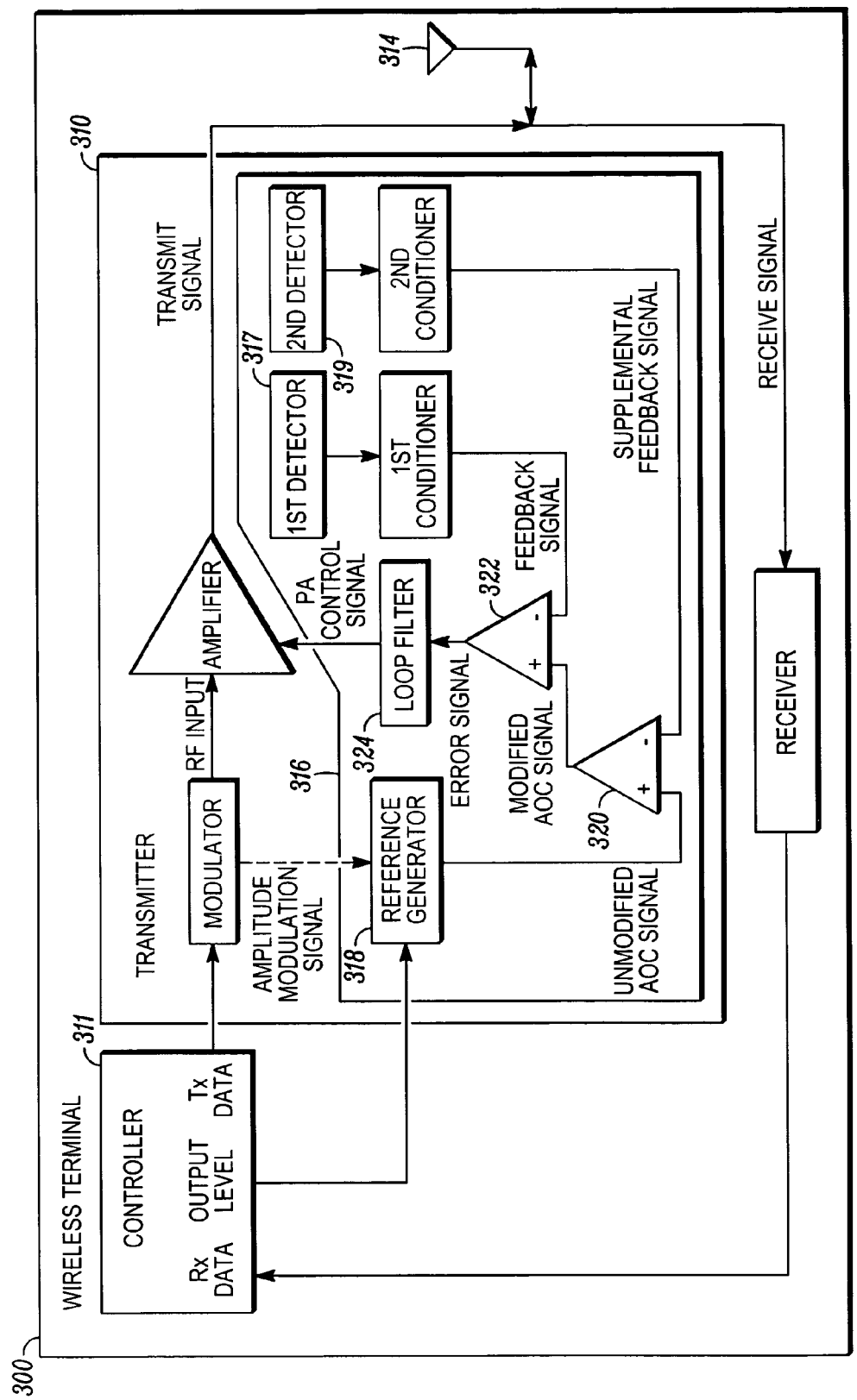
FIG. 3 is a wireless transmitter architecture.

In FIG. 3, the illustrative wireless communication device or terminal 300 comprises a transmitter 310 having an amplifier with an output coupled to an antenna load 314. The device includes a controller 311 for providing data and output level control information to the transmitter 310. The transmitter includes an automatic output controller (AOC) 316 having a reference generator 318. The AOC 316 includes a first detector 317 that detects the first parameter and a second detector 319 that detects the second parameter. In the embodiment of FIG. 3, first and second feedback signals are provided based on the detected first and second parameters. One of the feedback signals is summed with an unmodified AOC signal at a summer 320, which generates a difference output in the form of a modified AOC signal. The other feedback signal is summed with the modified AOC signal at summer 322, which generates a difference output in the form of an error signal.

The error signal is output from the AOC to the amplifier control input. In some embodiments, the error signal is filtered by a loop filter 324, as discussed above.

An analysis of an AOC system follows assuming an open loop voltage controlling AOC supplemented with current feedback. In this example, an output power, $P_{OUT}$, of 2.5 W (34 dBm) is calibrated with a nominal load impedance, $R_0$, of 50Ω, and a supply voltage, $V_{SUPPLY}$, of 3.6V. For the analysis, ideal equations pertaining to switch-mode power amplifiers are employed and the non-ideal effects such as non-ideal transistor on-resistance, saturation resistance, saturation voltage, and harmonic termination impedance, are treated with a single efficiency effect, η, of 60%. We use the convention of varying the load impedance on the complex voltage reflection along a trajectory of constant Voltage Standing Wave Ratio (VSWR)=4. The voltage reflection coefficient, Γ, magnitude is $$/\Gamma/=(VSWR-1)/(VSWR+1). \qquad (1)$$

The trajectory is defined as the variation of phase (Γ) from 0 to 2π radians. Complex values of Γ are determined by $$\Gamma=/\Gamma/Cos(phase(\Gamma))+j/\Gamma/Sin(phase(\Gamma)). \qquad (2)$$

These formulae may be used to map each value of phase Γ between 0 and 2π to a corresponding value of complex load impedance $Z_L$ $$Z_L=R_0(1+\Gamma)/(1-\Gamma)=R+jX,$$

where $R_0$ is the nominal load resistance, which is typically 50 Ohms. The constant $K=(P_{OUT}*R_0)/(V_{SUPPLY}^2)$. The value of K is provided for this example assuming a transformer coupled output Current-switching Mode Class D (CMCD) amplifier, $$K_{CMCD}=(8/\pi)^2. \qquad (3)$$

The primary to secondary turn ratio, m, for a transformer coupled current-switching mode class D (CMCD) PA is $$(m)_{CMCD}=(K_{CMCD})(V_{SUPPLY}/R_0)(\eta/P_{OUT})=0.224. \qquad (4)$$

Replacing the ideal load impedance, $R_0$, of 50Ω with a non-ideal load impedance, $Z_L=R+jX$, the supply current follows the following ideal equation:

$$I_{SUPPLY}=(K)(V_{SUPPLY}/(/Z_L/(m^2))) \qquad (5)$$

where $/Z_L/$ denotes the magnitude of the complex $Z_L$, and the output power is $$P_{OUT}=(I_{SUPPLY})(V_{SUPPLY})(\eta)(\rho) \qquad (6)$$

where $$\rho=R/(/Z_L/). \qquad (7)$$

For the case of a closed loop current controlling AOC, a supply current detector and feedback control is employed. The PA transconductance is defined as $$G_{PA}=(K/(/Z_L/(m^2))), \text{ and} \qquad (8)$$

$$G_{PA,NOM}=(K/(R_0(m^2))). \qquad (9)$$

Assuming the PA is controlled by varying a control voltage, $V_{PAC}$, then it varies with varying load impedance according to $$V_{PAC}=Pout(1+(HG_{PA,NOM}))/(1+(HG_{PA})) \qquad (10)$$

where H is the feedback gain which is the combined gain of the detector conditioner and difference amplifier.

A large feedback gain, H, ensures that the supply current tracks the AOC signal, which in this case is set to the nominal supply current. If the AOC is a secondary AOC for controlling a second output parameter, a large feedback gain is undesirable, since it would over-ride the effect of the primary AOC for controlling the first output parameter. A low gain feedback setting is necessary to achieve stabilization of output power with load impedance variation.

Figure 4:
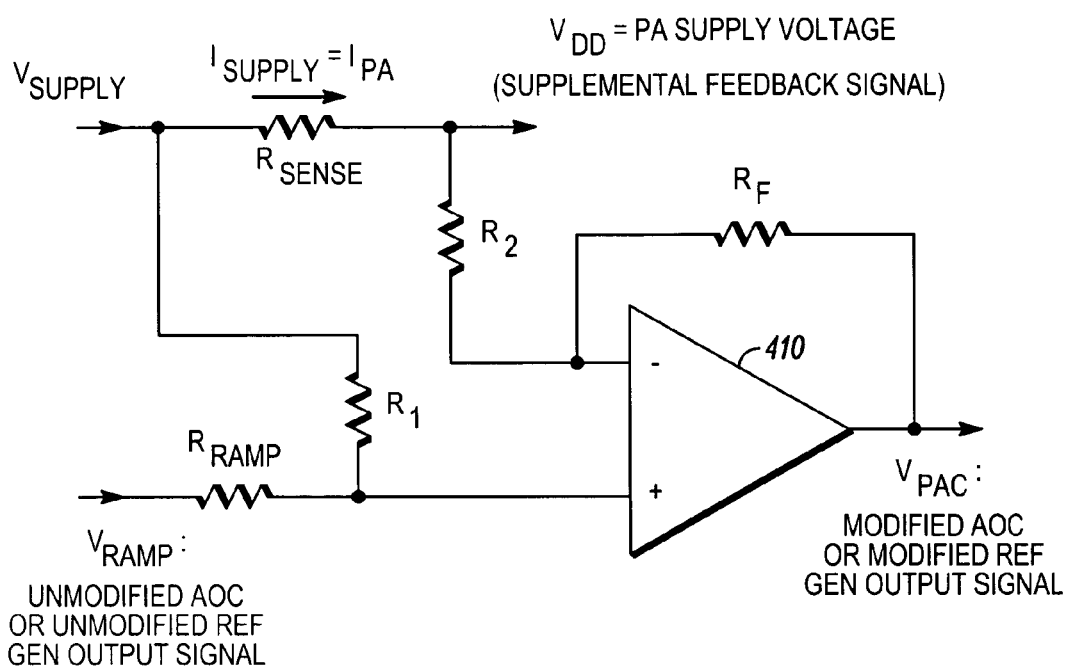
FIG. 4 is a secondary supply current feedback circuit.

FIG. 4 is an illustrative secondary feedback circuit 400 for supply current feedback wherein the functions of the detector, conditioner, and difference amplifier are provided by an operational amplifier circuit 410. The circuit of FIG. 4 is suitable for use with the open loop system of FIG. 1 and the closed loop system of FIG. 3. In FIG. 4, when $R_2=R_1$ and $R_F=R_{RAMP}$, then the gain, $V_{PAC}/V_{RAMP}$, is equal to 1 and the sensitivity to supply voltage $V_{PAC}/V_{SUPPLY}$ is equal to 0, which is desirable for output power stability versus supply voltage. The overall transfer function is $$V_{PAC}=V_{RAMP}-(H)I_{SUPPLY} \qquad (11)$$

where $$H=R_{SENSE}*R_F/R_2 \qquad (12)$$

is the feedback gain.

In this case the primary AOC may be an open loop AOC in which the PA control signal is the PA supply voltage. In the present disclosure, H is a supplemental feedback gain, which needs to be set to a small, non-zero level. For the limit case of H=0 the secondary feedback gain is zero and the performance is the same as a voltage controlling AOC. For the case where H is very large, the secondary parameter dominates, and the performance is the same as a current controlling AOC. Hence the value of H is designed such that the secondary feedback gain is low, and neither the primary AOC nor the secondary AOC dominates the performance.

Figure 5:
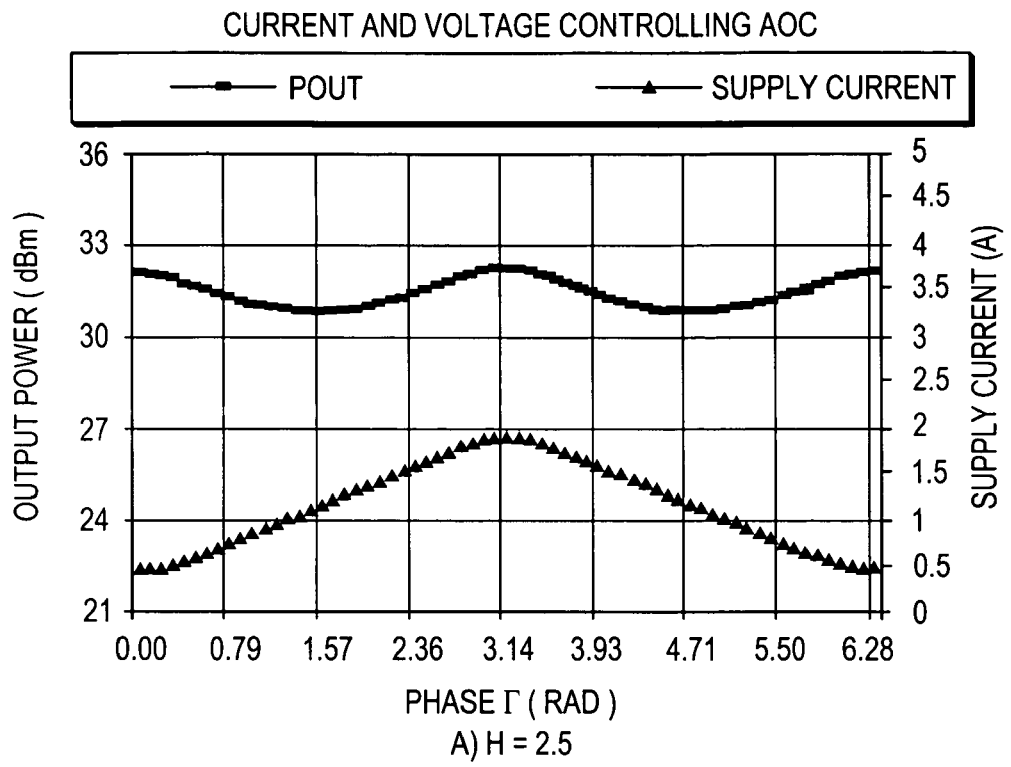
FIG. 5 is a plot of amplifier output power and supply current of versus phase ($\Gamma$).
Figure 6:
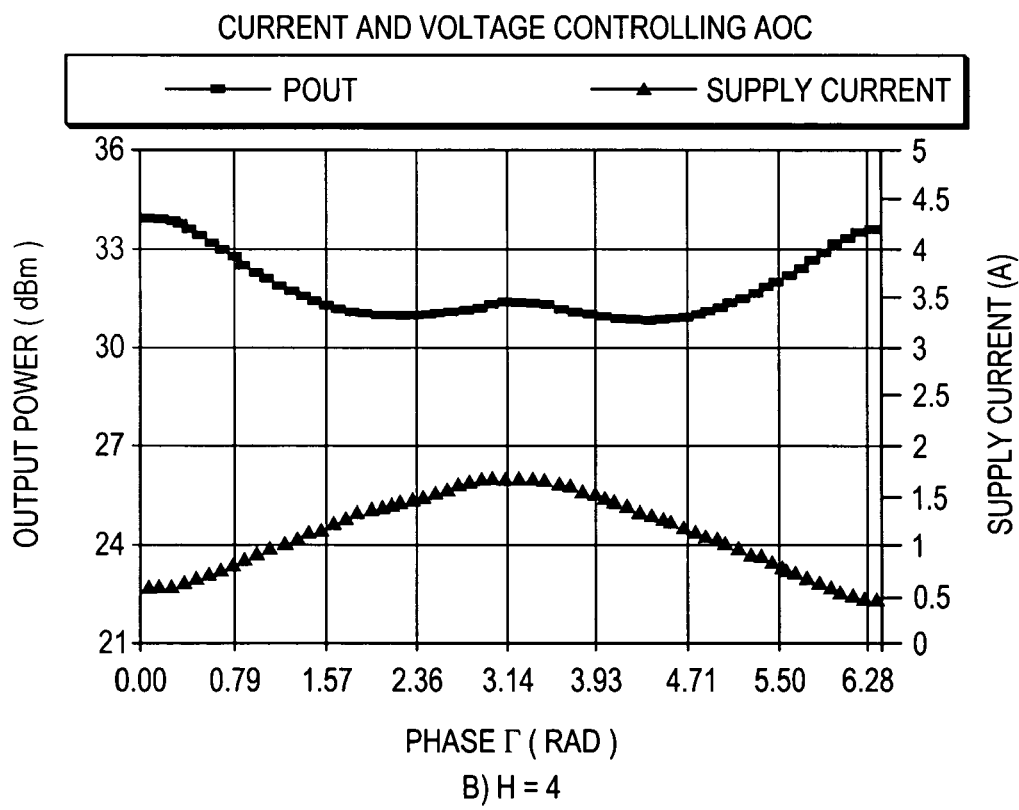
FIG. 6 is a plot of amplifier output power and supply current of versus phase ($\Gamma$).
Figure 7:
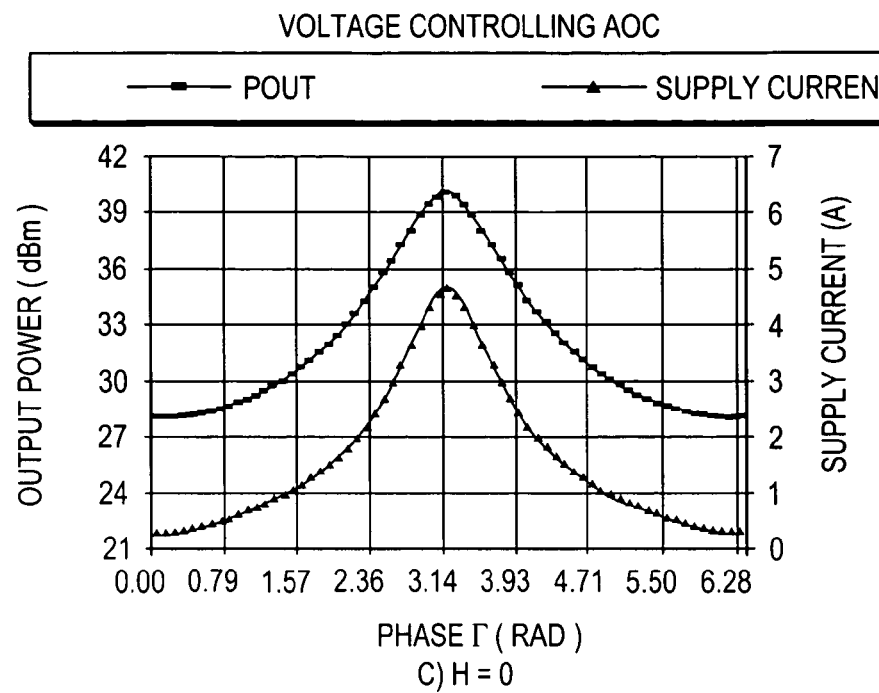
FIG. 7 is a plot of amplifier output power and supply current of versus phase ($\Gamma$).
Figure 8:
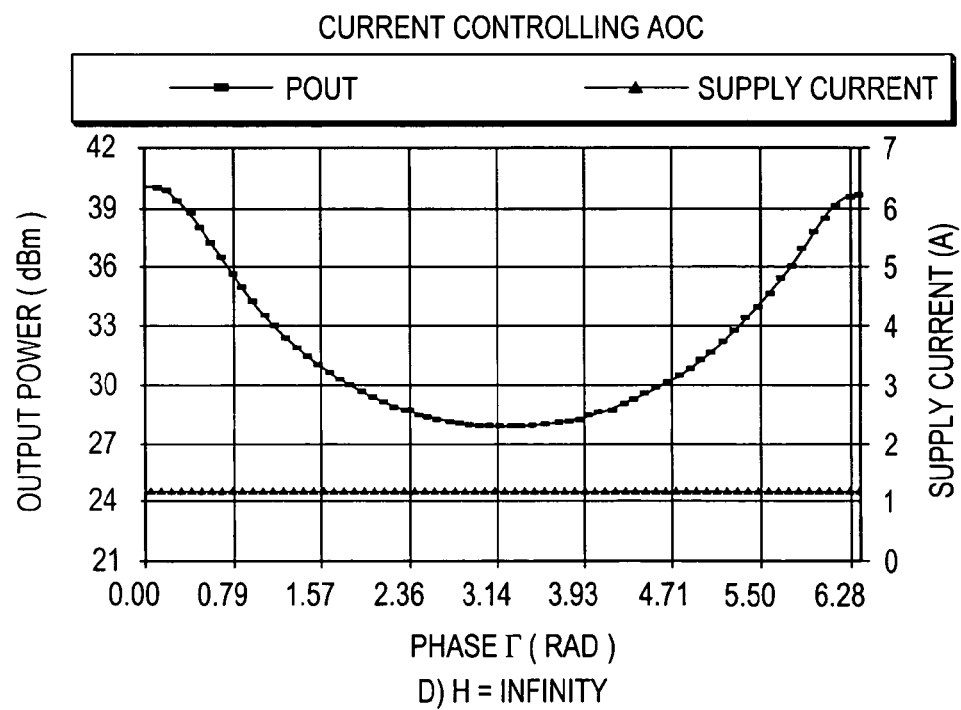
FIG. 8 is a plot of amplifier output power and supply current of versus phase ($\Gamma$).

Examples of AOC performance are plotted in FIGS. 5-8 wherein the output power and supply current of the PA are plotted versus phase (Γ). In FIGS. 5 and 6, secondary feedback values of H=2.5 and H=4 are shown, respectively. These feedback values provide a low peak to peak output power variation and a moderate current drain. FIGS. 7 and 8 illustrate the effect of H=0 and H=infinity, respectively. These feedback values allow high peak to peak output power variation. Note that in both FIGS. 5 and 6, the reduced supply current variation and reduced output power variation are achieved in real-time and without the use of limiting or other non-linear feedback techniques, which may cause unwanted spectral emissions or modulation distortion.

A similar analysis can be made for the case in which the primary AOC is a closed loop AOC. In this case, the AOC may be analyzed as if it were a closed loop AOC and the detector detects a function of output current and output voltage, such as voltage plus current. Voltage controlling behavior as shown in FIG. 7, current controlling behavior as shown in FIG. 8, or the advantageous voltage and current controlling behavior as shown in FIGS. 5 and 6 can be obtained by adjusting the relative scaling of detected voltage and current. While only first order linear combinations of voltage and current have been discussed, second order functions of voltage or the logarithm of voltage and current or the logarithm of current, including cross products, provide similar performance advantages.

While the present disclosure and what are presently considered to be the best modes thereof have been described in a manner establishing possession by the inventors and enabling those of ordinary skill in the art to make and use the same, it will be understood and appreciated that there are many equivalents to the exemplary embodiments disclosed herein and that modifications and variations may be made thereto without departing from the scope and spirit of the inventions, which are to be limited not by the exemplary embodiments but by the appended claims.

What is claimed is:

1. A method in a wireless transmitter having an amplifier and an automatic output controller, the method comprising:
   the automatic output controller detecting a parameter of the transmitter, the parameter changes with a change in load impedance of the transmitter during a transmission,
   the automatic output controller having a reference generator providing an amplifier control signal output, modifying the output of the reference generator based on the detected parameter;
   the automatic output controller reducing a change in transmitter output power related to the change in load impedance based on another parameter and based on the modified output of the reference generator.

2. The method of claim 1, the automatic output controller providing non-limiting control of the amplifier.

3. The method of claim 1, the another parameter is an output voltage, providing the amplifier control signal output includes providing a DC supply voltage.

4. The method of claim 1, the another parameter is an output current, providing the amplifier control signal output includes providing a DC supply current control signal.

5. The method of claim 1,
   modifying the output of the reference generator based on low gain feedback of the detected parameter,
   the feedback reducing the variation in output power with load impedance.

6. The method of claim 1, providing an amplifier control signal from the automatic output controller, the amplifier control signal based on a calibrated input signal to the automatic output controller, the calibrated input signal being calibrated for a particular amplifier output level at a nominal load impedance.

7. The method of claim 1,
   the automatic output controller is an amplitude modulating automatic output controller,
   controlling the amplitude modulation of the amplifier output using the amplitude modulating automatic output controller.

8. A wireless transmitter, comprising:
   an amplifier having an output coupled to a load, the output having first and second parameters, the amplifier having a control signal input, the first parameter dependent on only the control signal input;
   an automatic output controller having an output coupled to the control signal input, the automatic output controller having a reference generator,
   the automatic output controller detecting the second parameter of the transmitter that changes with a change in load impedance of the transmitter during a transmission, the automatic output controller modifying an output of the reference generator based on the detected second parameter,
   the automatic output controller reducing a change in transmitter output power related to the change in load impedance based on the first parameter and the modified output of the reference generator during the same transmission during which the second parameter was detected.

9. The transmitter of claim 8, the first parameter is an output voltage, the amplifier control signal input is a DC supply voltage.

10. The transmitter of claim 8, the first parameter is an output current, the amplifier control signal input is a DC supply current control signal.

11. The transmitter of claim 8, the automatic output controller having a summer modifying the output of the reference generator based on low gain feedback of the detected second parameter.

12. The transmitter of claim 8, the automatic output controller having a reference generator,
   the automatic output controller including a first detector that detects the first parameter and a second detector that detects the second parameter,
   the first detector providing a first feedback signal based on the detected first parameter,
   the second detector providing a second feedback signal based on the detected second parameter,
   an error signal generator providing an error signal proportional to a difference between an output of the reference generator and a summation of the first and second feedback signals, the modified output signal of the automatic output controller based on the error signal.

13. The transmitter of claim 8,
   the first parameter is an output voltage, the second parameter is an output current,
   the automatic output controller having a current detector for detecting the second parameter,
   the output of the automatic output controller based on the detected output current.

14. The transmitter of claim 8,
   the first parameter is an output current, the second parameter is an output voltage,
   the automatic output controller having a voltage detector for detecting the second parameter,
   the output of the automatic output controller based on the detected output voltage.

15. The transmitter of claim 8, a radio controller having a calibrated output coupled to the automatic output controller, the automatic output controller responsive to the calibrated output, the calibrated output being calibrated for a particular amplifier output level at a nominal load impedance.

16. The transmitter of claim 8,
   a modulator producing an amplitude modulation signal,
   the automatic output controller responsive to the amplitude modulation signal of the modulator such that the amplitude modulation signal determines the amplitude modulation of the amplifier output.

17. A wireless transmitter, comprising:
   an amplifier;
   an automatic output controller coupled to the amplifier, the automatic output controller is a closed loop controller having a reference generator,
   the automatic output controller having an input configured to detect first and second parameters of the transmitter, the second parameter changes with a change in load impedance during transmission,
   the automatic output controller having an output configured to provide an amplifier control signal proportional to a difference between an output of the reference generator and a summation of the first and second signals,
   the automatic output controller configured to reduce a change in transmitter output power related to the change in load impedance based on the amplifier control signal during the same transmission during which the first and second parameters were detected.

18. A wireless transmitter, comprising:

an amplifier;

an automatic output controller coupled to the amplifier, the automatic output controller having a reference generator, the automatic output controller having an input configure to detect an output voltage and an output current of the transmitter, the output current changes with a change in load impedance of the transmitter during a transmission, the automatic output controller configured to modify an output of the reference generator based on the detected output current, the automatic output controller configured to reduce a change in transmitter output power related to the change in load impedance based on the modified output of the reference generator and the detected output voltage during the same transmission during which the output current and output voltage were detected.

19. The transmitter of claim 18, the output current is a supply current.

* * * * *